United States Patent
Kim

(10) Patent No.: US 7,221,305 B2
(45) Date of Patent: May 22, 2007

(54) APPARATUS AND METHOD FOR CONVERTING AN ANALOG AUDIO SIGNAL INTO DIGITAL DATA

(75) Inventor: Ji-woon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/998,980

(22) Filed: Nov. 30, 2004

(65) Prior Publication Data
US 2005/0116848 A1    Jun. 2, 2005

(30) Foreign Application Priority Data
Dec. 1, 2003    (KR) .................... 10-2003-0086313

(51) Int. Cl.
*H03M 1/12* (2006.01)
(52) U.S. Cl. .................... 341/155; 341/139; 341/50; 704/270
(58) Field of Classification Search ................ 341/155, 341/50, 139; 704/270
See application file for complete search history.

(56) References Cited

U.S. PATENT DOCUMENTS

| | | | | |
|---|---|---|---|---|
| 5,056,145 | A | * | 10/1991 | Yamamoto et al. ......... 704/270 |
| 5,787,399 | A | * | 7/1998 | Lee et al. .................... 704/270 |
| 6,778,124 | B2 | | 8/2004 | Hashimoto et al. |
| 7,039,540 | B1 | | 5/2006 | Dahle et al. |
| 7,039,700 | B2 | | 5/2006 | Saeidi |

FOREIGN PATENT DOCUMENTS

| | | |
|---|---|---|
| JP | 2000-68764 | 3/2000 |
| JP | 2003-36081 | 2/2003 |
| JP | 07123192 A * | 5/2005 |
| KR | 2001-0069079 | 7/2001 |
| KR | 2002-0059460 | 7/2002 |

* cited by examiner

*Primary Examiner*—Jean Bruner Jeanglaude
(74) *Attorney, Agent, or Firm*—Roylance, Abrams, Berdo & Goodman, L.L.P.

(57) ABSTRACT

A method and apparatus are provided for converting an analog audio signal into digital data. A signal with small magnitude more closely approximates the original signal by varying an amplification ratio depending on the magnitude of an input analog audio signal so that the input analog audio signal can be amplified to maximum possible amplitude corresponding to the number of bits that can be stored when converting the analog audio signal into digital data. The amplitude of an amplified analog audio signal also can be reconstructed if necessary, thereby providing better sound quality with the same level of sound.

18 Claims, 13 Drawing Sheets

APPARATUS AND METHOD FOR CONVERTING AN ANALOG AUDIO SIGNAL INTO DIGITAL DATA

CROSS-REFERENCE TO RELATED APPLICATION

This application claims the benefit under 35 U.S.C. § 119(a) to Korean Patent Application No. 10-2003-0086313 filed on Dec. 1, 2003 in the Korean Intellectual Property Office, the disclosure of which is incorporated herein by reference in its entirety.

BACKGROUND OF THE INVENTION

1. Field of the Invention

The present invention relates to an apparatus and method for the conversion of analog audio signals into digital data. More particularly, the invention is directed to an apparatus and a method for converting analog audio signals into digital data designed to provide a sound quality that is substantially the same as the original sound.

2. Description of the Related Art

With advancement of digital technology, various multimedia data are converted into a digital format for easy storage, archiving, and processing.

Quantization is a process of representing or converting an analog continuous signal into digital data, resulting in a quantization error. As the number of levels used for each sample increases during sampling in converting the analog audio signal into digital data, the digital data is a closer representation of the original sound.

Referring to FIG. 1, a general apparatus for converting an analog audio signal into digital data includes an input 10 into which an analog audio signal is input, an amplifier 20 that amplifies the input analog audio signal at a predetermined amplification ratio, a converter 30 that converts the amplified analog audio signal into digital data, a digital signal processor 40 that performs overall signal processing in order to store the created digital data, a storage unit 50 that stores the created digital data, and a reproducer 60 that reproduces the digital data stored in the storage unit 50.

The operation of the apparatus having the above-described configuration is described with reference to FIG. 2. Referring to FIG. 2, when an analog audio signal is input to the input 10 in step S1, the input analog audio signal is amplified by the amplifier 20 having a predetermined ratio of amplification in step S2. In step S3, the amplified analog audio signal is sent to the converter 30 that then converts the analog audio signal into digital data.

In step S4, the created digital data is sent to the digital signal processor 40 which then performs overall signal processing in order to store the digital data. In step S5, the digital data processed by the digital signal processor 40 is stored in the storage unit 50. Then, when reproducing a digital signal, the reproducer 60 extracts the digital signal stored in the storage unit 50.

In the apparatus for converting an analog audio signal into digital data, the amplifier 20 has a fixed amplification ratio that is sufficiently low to amplify an audio signal with large magnitude.

Thus, when the magnitude of a signal fed into the input 10 is small, a quantization error introduced by quantization is large compared to an actual audio signal. This quantization error causes the quantized signal to sound quite different from the original sound.

SUMMARY OF THE INVENTION

The present invention provides an apparatus and method for converting an analog audio signal into digital data designed to provide digital data more closely approximating the original sound by minimizing a quantization error.

According to an aspect of the present invention, there is provided an apparatus for converting an analog audio signal into digital data including an amplifier that amplifies an input analog audio signal to maximum possible amplitude that can be stored as digital data, a converter that converts the amplified analog audio signal into digital data, and a storage unit that can store the digital data.

According to another aspect of the present invention, there is provided a method for converting an analog audio signal into digital data including the steps of: amplifying an input analog audio signal to maximum amplitude that can be stored as digital data; converting the amplified analog audio signal into digital data; and storing the created digital data.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

The present invention will now be described more fully with reference to the accompanying drawings, in which preferred embodiments of the invention are shown.

When converting an analog audio signal into digital data, the number of levels that the analog signal can be sampled determines the sound quality of created digital data.

Figure 1:
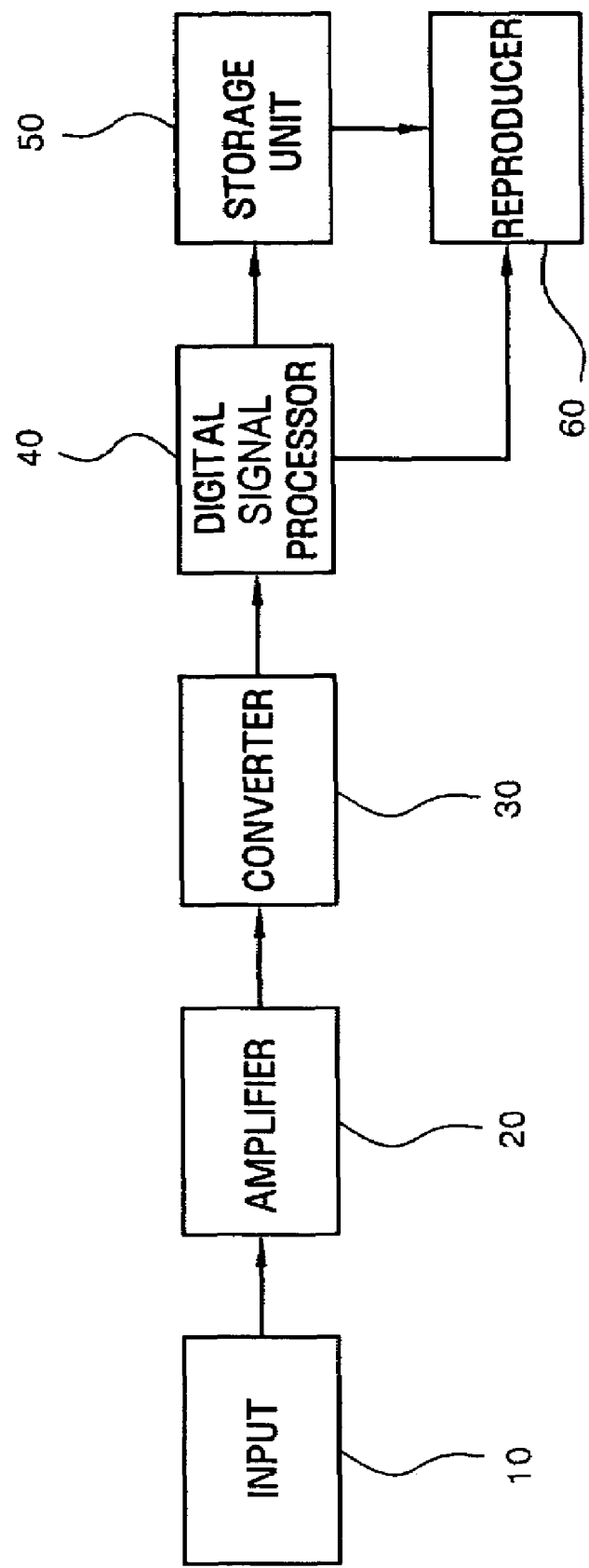
FIG. 1 is a block diagram of a conventional apparatus for converting an analog audio signal into digital data.
Figure 2:
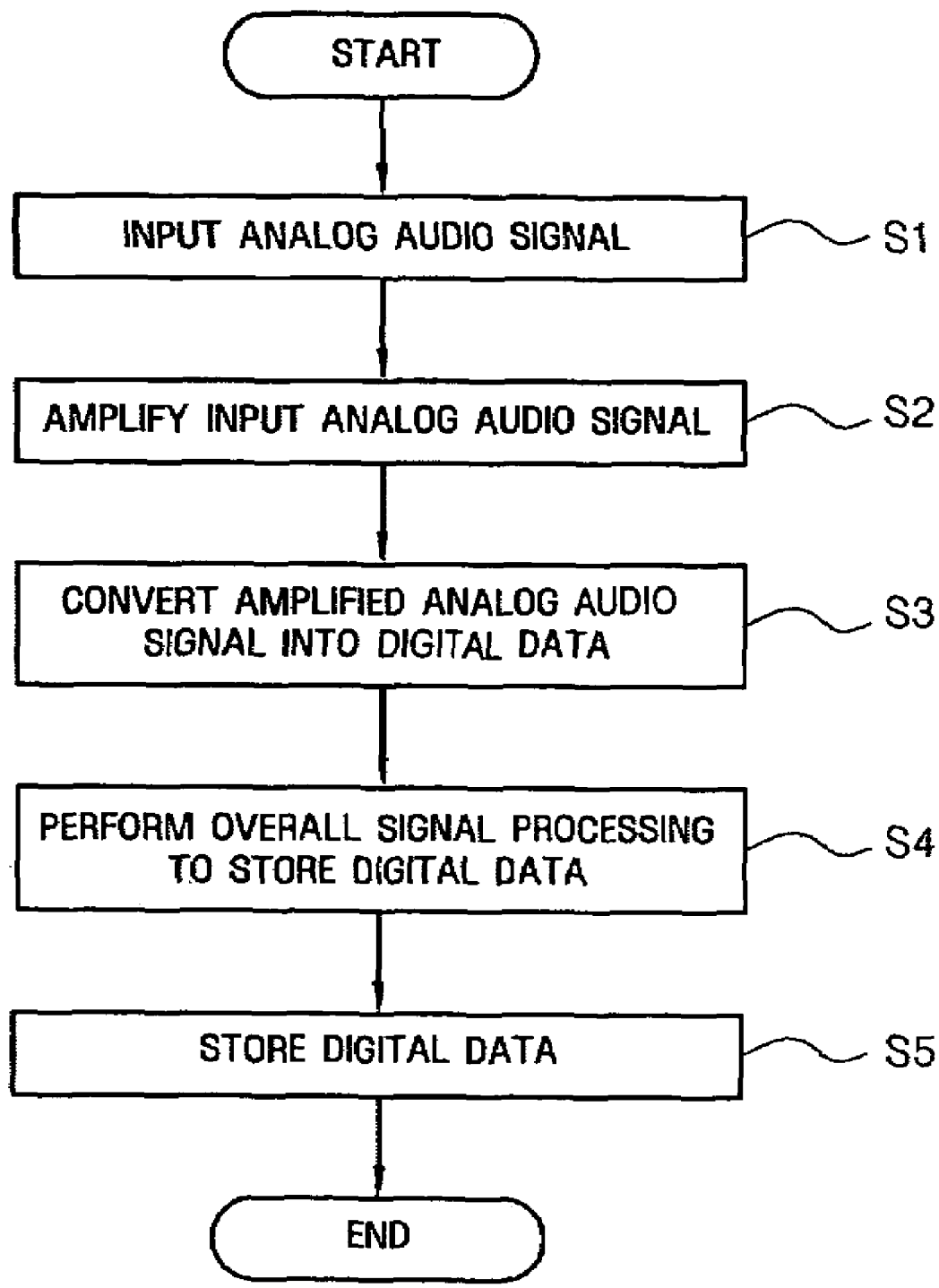
FIG. 2 is a flowchart illustrating a conventional method for converting an analog audio signal into digital data.
Figure 3A:
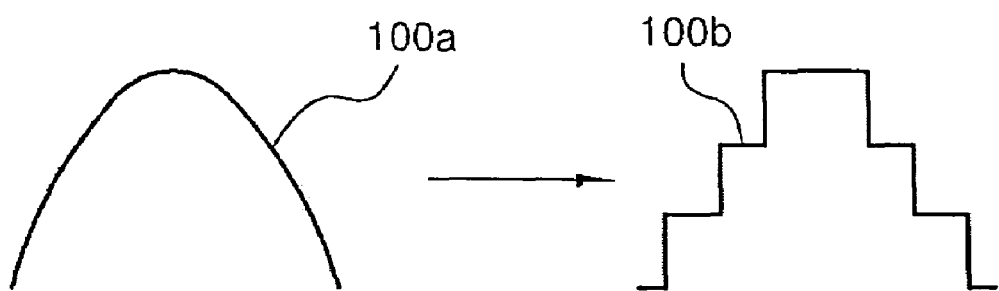
FIG. 3A shows waveforms illustrating the principle of operation of an apparatus for converting an analog audio signal sampled using two bits into digital data according to an embodiment of the present invention.
Figure 3B:
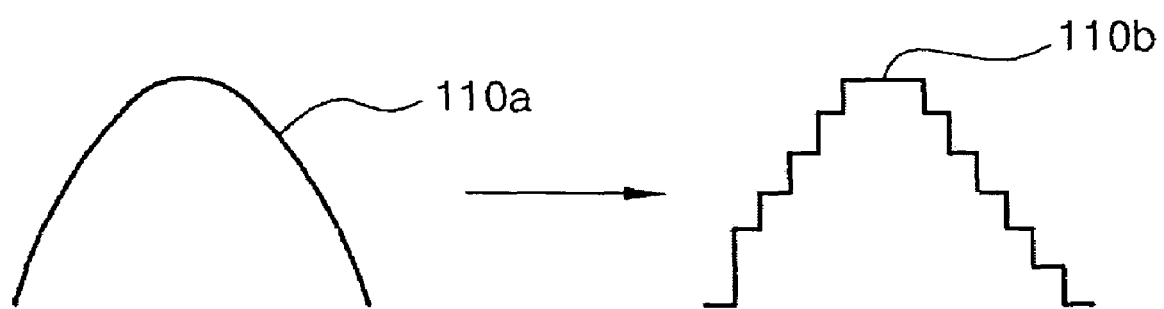
FIG. 3B shows waveforms illustrating the principle of operation of an apparatus for converting an analog audio signal sampled using three bits into digital data according to an embodiment of the present invention.

As shown in FIG. 3B, for example, digital data 110b created after an input analog audio signal 110a is sampled using 3 bits is closer to the original sound than digital data 100b shown in FIG. 3A created after an input analog audio signal 100a is sampled using 2 bits.

That is, as the amount of data created when converting an incoming analog audio signal into digital data increases, the resulting digital data more closely approximates the original sound.

According to an embodiment of the present invention, an apparatus for converting an analog audio signal into digital data can increase the amount of data by amplifying the amplitude of the incoming audio signal.

Figure 4A:
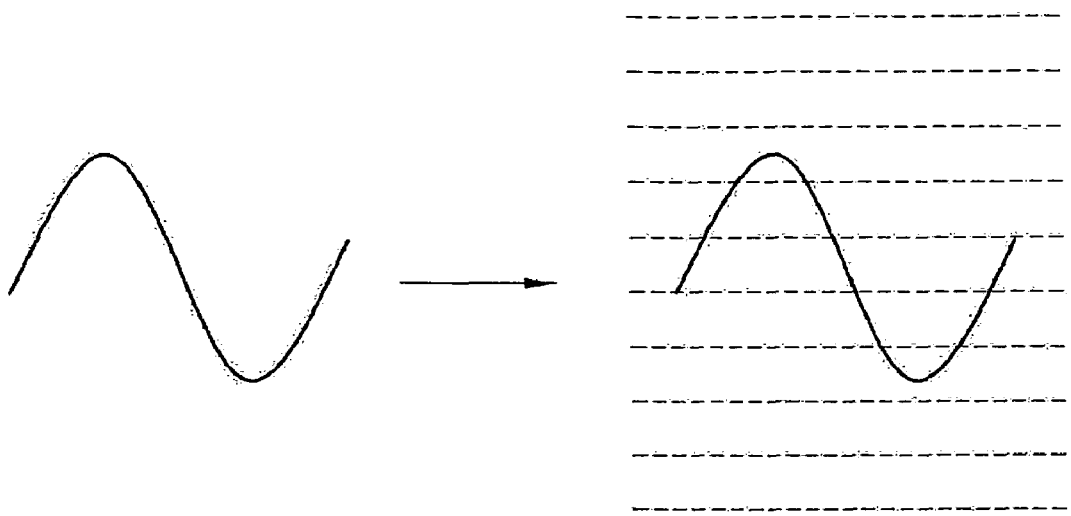
FIG. 4A shows an analog audio signal amplified by an apparatus for converting an analog audio signal into digital data according to an embodiment of the present invention.
Figure 4B:
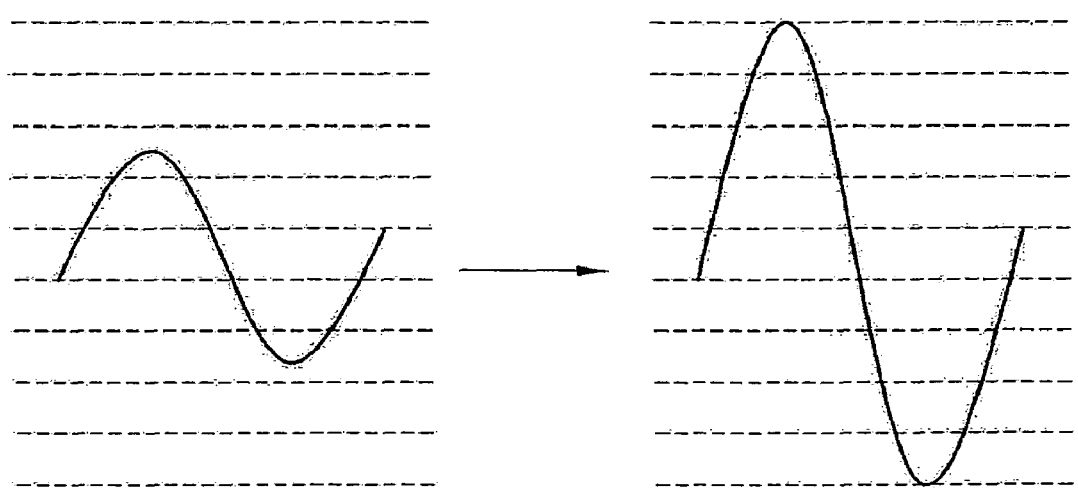
FIG. 4B shows an analog audio signal amplified at a higher amplification ratio than the signal illustrated in FIG. 4A by an apparatus for converting an analog audio signal into digital data according to an embodiment of the present invention.

As shown in FIG. 4B, an incoming analog audio signal can be represented by increased levels when the analog audio signal is amplified and sampled compared with the signal that is only sampled using 10 bits without amplification as shown in FIG. 4A. The finer quantization allows the sampled signal to approximate the original signal.

Figure 5:
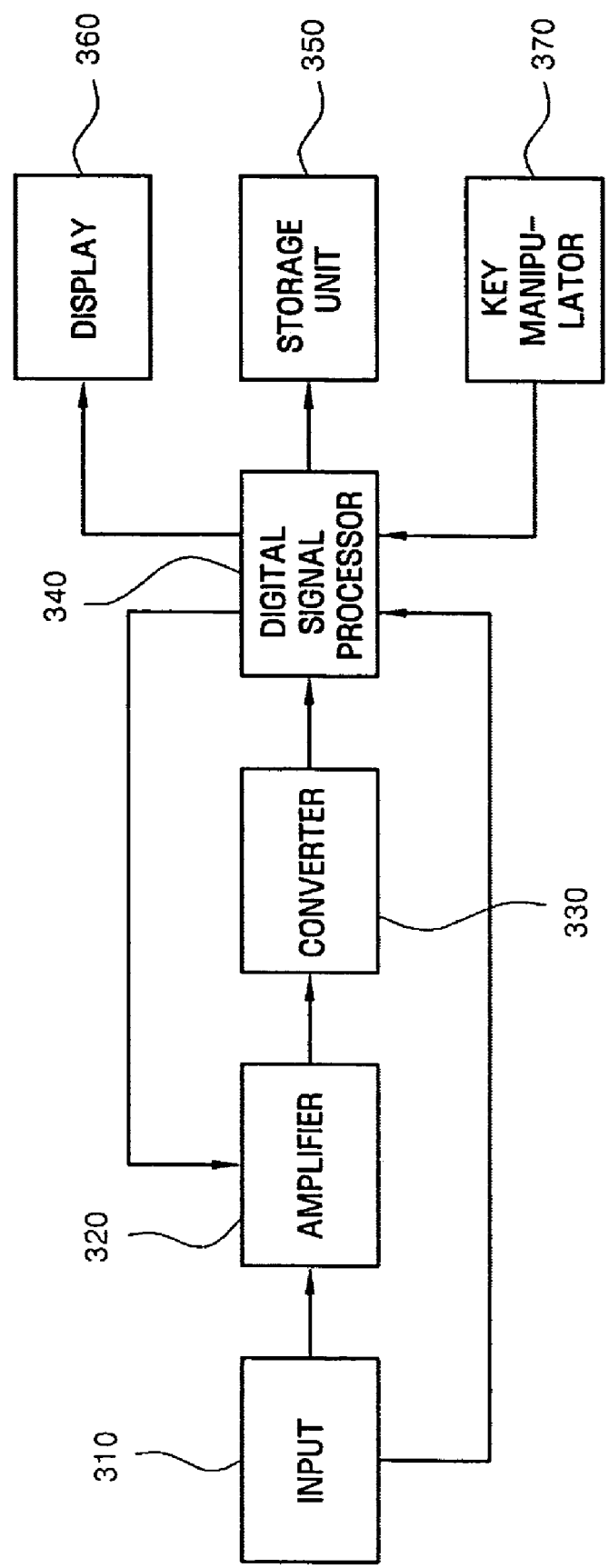
FIG. 5 is a block diagram of an apparatus for converting an analog audio signal into digital data according to a first embodiment of the present invention.

Referring to FIG. 5, an apparatus for converting an analog audio signal into digital data in order to increase the amount of data obtained by sampling includes an input 310 into which an analog audio signal is fed. An amplifier 320 that amplifies the amplitude of the incoming analog audio signal to a maximum value possible for storing the analog audio signal is connected to the input 310. A converter 330 is connected to the amplifier 320 for converting the amplified analog signal into digital data. A digital signal processor 340 is connected to the converter 330 to perform overall signal processing in order to store the created digital data. A storage unit 350 tat stores the digital data is connected to the digital signal processor 340.

The apparatus of FIG. 5 further includes a display 360 that displays a ratio of amplitude of the incoming analog audio signal to the maximum possible amplitude that can be stored in the storage unit 350 and a key manipulator 370 that allows a user to adjust the amplification ratio of the amplifier 320.

The amplifier 320 brings the amplitude of the analog audio signal fed through the input 310 to a maximum level possible without distortion in the audio signal caused by clipping. The maximum possible amplitude as used herein refers to an amplitude that can be represented by bits in the digital data being stored in the storage unit 350.

Also, the maximum possible amplitude is not limited by the capacity of the storage unit 350 but can vary depending on the format of a digital data stream.

Accordingly, it is possible to increase the number of levels by which the incoming analog audio signal can be represented when converting the audio signal into digital data in the converter 330, thereby making the quality of the digital data closer to the quality of the original sound.

Figure 6:
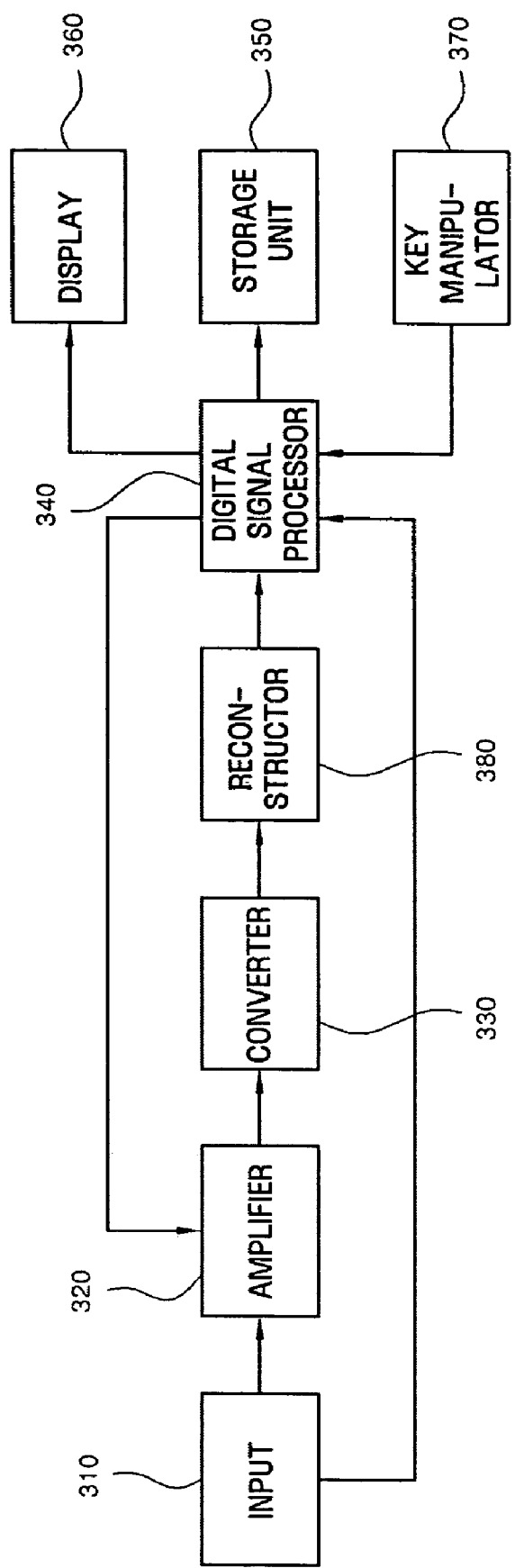
FIG. 6 is a block diagram of an apparatus for converting an analog audio signal into digital data according to a second embodiment of the present invention.

FIG. 6 depicts another embodiment of the invention that is similar to the embodiment of FIG. 5, where identical elements are identified by the same reference numbers. When amplifying the incoming analog audio signal, the amplifier 320 increases the volume as well. Referring to FIG. 6, in order to recover the increased volume size to an original state, the apparatus in this embodiment further includes a reconstructor 380 that restores the volume of digital data created by the converter 330. When the resolution of the converter 330 is less than the number of bits in digital data that can be stored in the storage unit 350, the reconstructor 380 not only restores the volume but also reduces a quantization error by increasing the number of levels used for sampling Assuming that the resolution of the converter 330 is 10 bits and the number of bits in digital data that can be stored in the storage unit 350 is 16, the input analog audio signal is converted into 10-bit digital data and then 6 of the least significant bits (LSBs) in the storage unit 350 are filled with zeros.

Figure 7:
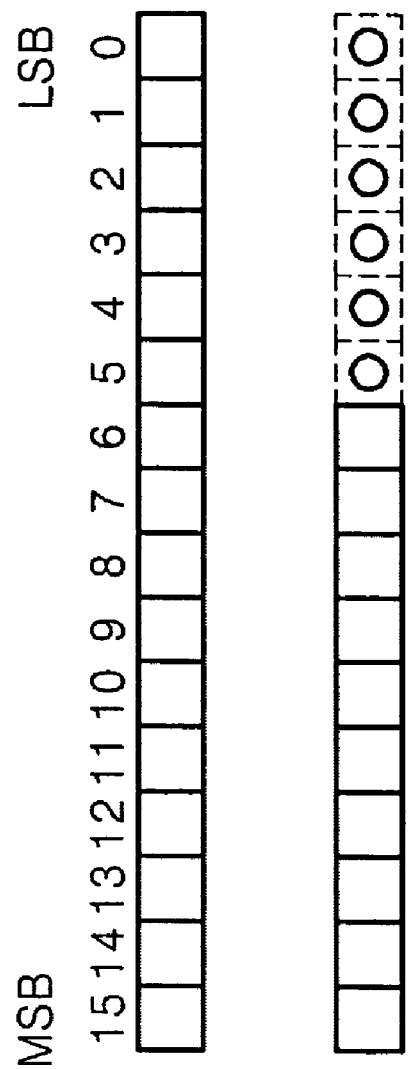
FIG. 7 illustrates a string of bits in digital data created by a converter according to an embodiment of the present invention.

Referring to FIG. 7, the reason of the foregoing is that bits in digital data produced by the converter 330 are filled from the most significant bit (MSB) of the storage unit 350 when the resolution of the converter 330 is different from the number of bits in data stored in the storage unit 350. The amplified analog audio signal is quantized to 10 bits and the maximum quantization error is 32 since an interval between adjacent quantization levels is 64.

When the analog audio signal fed through the input 310 has an amplitude range of −512 to 511, the amplifier 320 amplifies the analog audio signal up to 64 times such that the maximum possible amplitude corresponding to the number of bits that can be stored in the storage unit 350 is in the range of −32768 to 32767. The converter 330 then converts the amplified analog audio signal into digital data, and the reconstructor 380 restores the increased amplitude to an original value.

Figure 8:
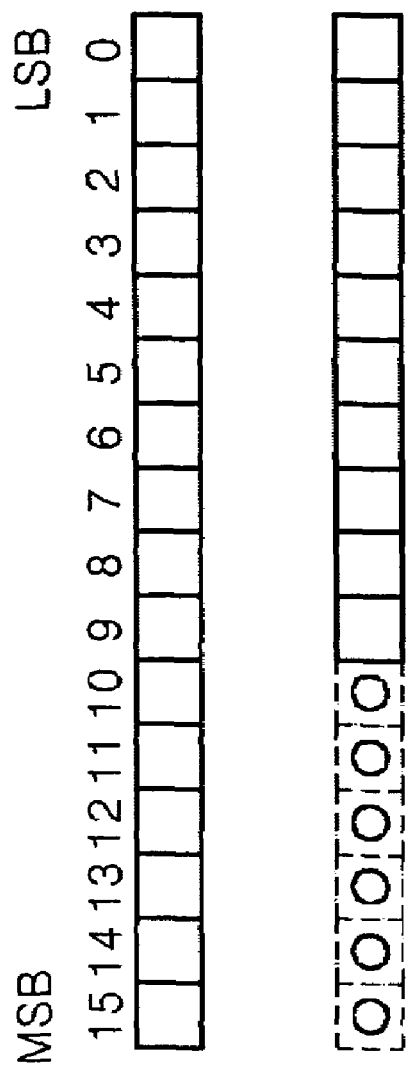
FIG. 8 illustrates a string of bits in digital data, which is reconstructed by a reconstructor according to an embodiment of the present invention.

As shown in FIG. 8, 6 bit data is shifted into LSB when converting the amplified analog audio signal into digital data to reconstruct the amplitude of an amplified audio signal. Thus, since the analog audio signal has amplitude values of −512 to 511 and can be represented using 10 bits (1024 levels), it is possible to obtain accurate digital data of good sound quality by reducing a quantization error. In this case, an interval between adjacent quantization levels is reduced to 1 as the digital data is shifted, which reduces a quantization error to less than 0.5.

Figure 9:
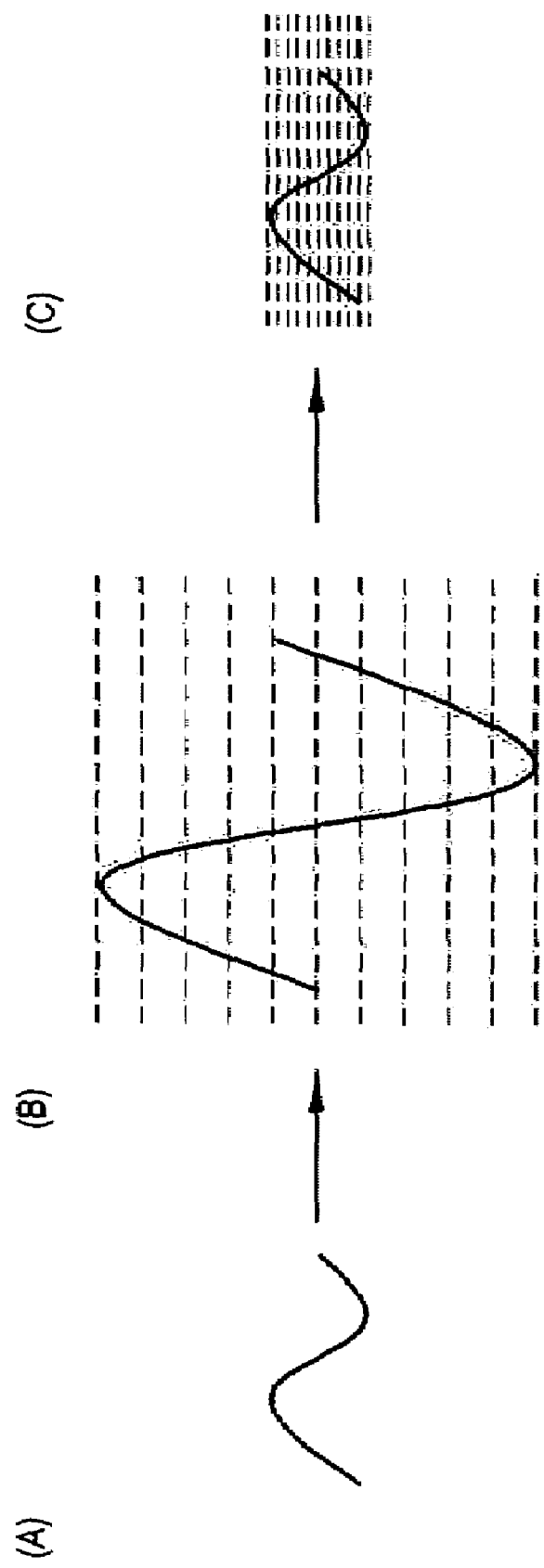
FIG. 9 shows waveforms that illustrate a process of reconstructing amplitude amplified by an apparatus for converting an analog audio signal into digital data according to an embodiment of the present invention.

A process of reconstructing the amplitude of an amplified analog audio signal will now be described in more detail with reference to FIG. 9. When an analog audio signal input as shown in FIG. 9(A) is amplified by the amplifier 320 to an amplitude level as shown in FIG. 9B and then converted into digital data by the converter 330. Then, when the digital data is reconstructed by the reconstructor 380, the amplified amplitude is restored to an original level as shown in FIG. 9C and a quantization error is reduced by the same ratio. This allows the input analog audio signal to be sampled at an increased number of levels.

While the maximum quantization error is 32 when converting the input analog audio signal into digital data at the converter 320, the maximum error is reduced to 0.5 when converting an analog audio signal with amplitude reconstructed by the reconstructor 380, thereby providing a closer representation to the original signal.

Figure 10:
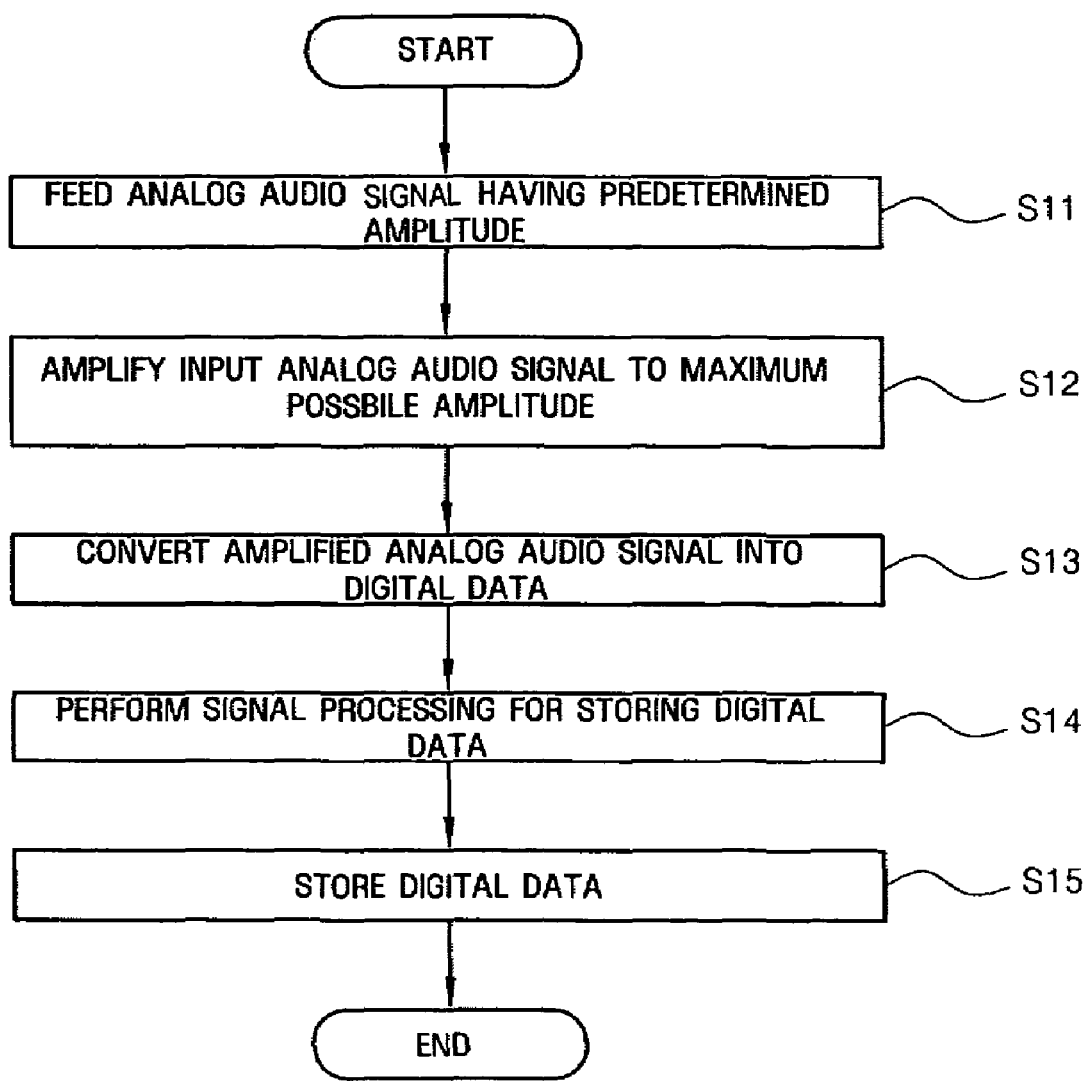
FIG. 10 is flowchart illustrating a method for converting an analog audio signal into digital data according to a first embodiment of the present invention.

A method for converting an analog audio signal into digital data using the apparatus configured above according to an embodiment of the present invention will now be described with reference to the flow chart of FIG. 10. The flow chart of FIG. 10 and the following discussion refer to the components of the assembly of FIGS. 5 and 6. In step S11, an analog audio signal having a predetermined amplitude is first fed through the input 310.

In this case, it is assumed that the amplitude of the input analog audio signal is less than maximum possible amplitude corresponding to the number of bits that can be stored in the storage unit 350.

In step S12, the input analog audio signal is amplified by the amplifier 320 to the maximum possible amplitude.

In step S13, the amplified analog audio signal is input into the converter 330 and converted into digital data.

In step S14, the overall digital signal processing is performed for storing the digital data produced by the converter 330 in the storage unit 350.

In step S15, the digital data processed by the digital signal processor 340 is stored in the storage unit 350.

Figure 11:
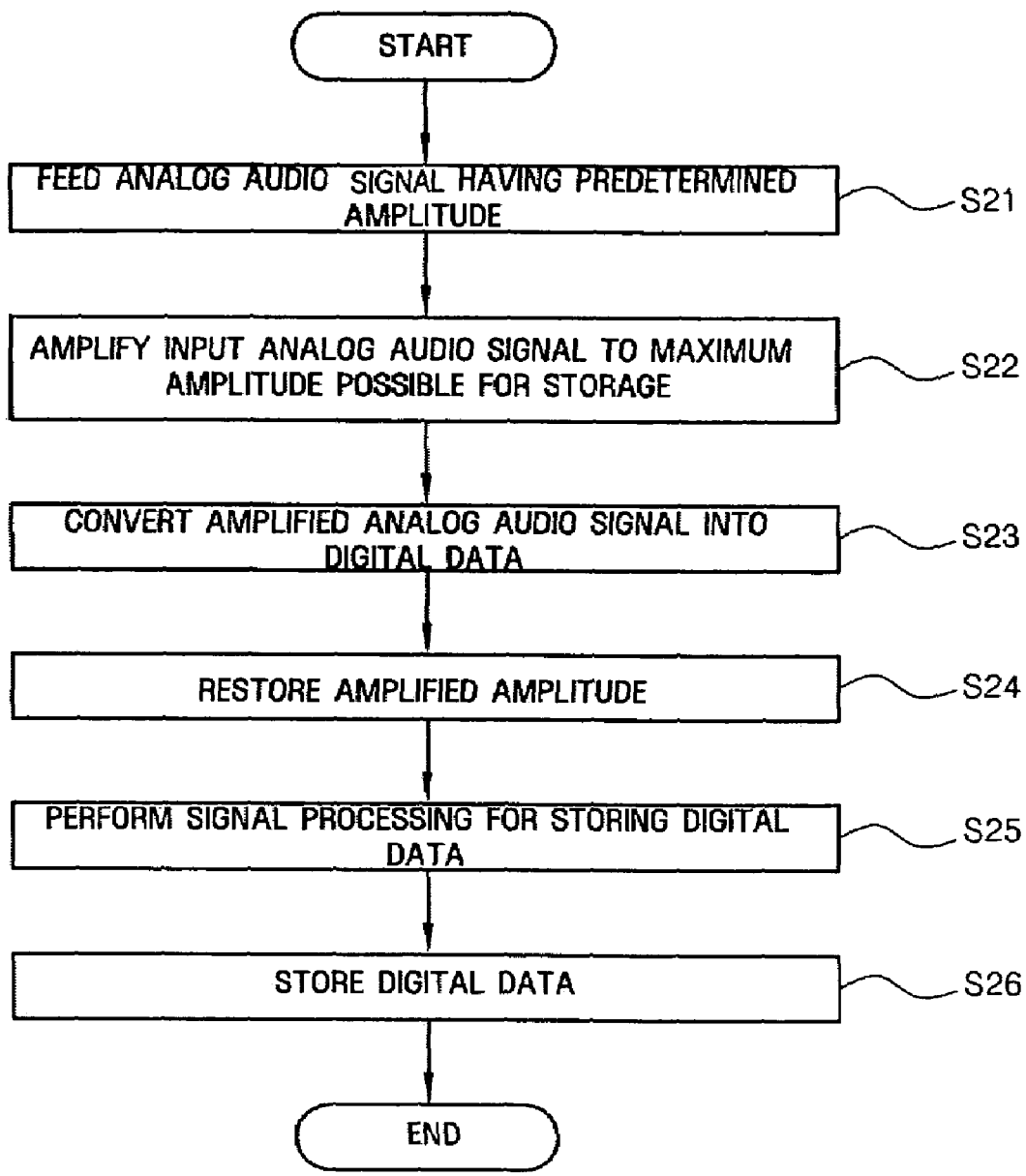
FIG. 11 is a flowchart illustrating a method for converting an analog audio signal into digital data according to a second embodiment of the present invention.

The method may further include reconstructing the amplitude of an analog audio signal amplified by the amplifier 320 as depicted by the flow chart of FIG. 11. The method illustrated by the flow of FIG. 11 refers to the components of the assembly of FIGS. 5 and 6. Referring to FIG. 11, when an analog audio signal having predetermined amplitude is fed into the input 310 in step S21, the input analog audio signal is amplified by the amplifier 320 to the maximum possible amplitude that can be stored in the storage unit 350 in step S22.

When the amplified analog audio signal is converted into digital data by the converter 330 in step S23, the amplified amplitude is restored to an original level by the reconstructor 380 in step S24.

In step S25, the digital data whose amplitude has been restored by the reconstructor 380 is subjected to overall processing for storing the same in the storage unit 350 by the digital signal processor 340.

In step S26, the digital data processed by the digital signal processor 340 is stored in the storage unit 350. In this case, to obtain digital data that more closely approximates the original analog signal, the amplitude of the input analog audio signal amplified by the amplifier 320 must not exceed the maximum possible amplitude.

When the amplitude of the amplified analog audio signal exceeds the maximum possible amplitude, signal distortion such as clipping may occur when quantizing the amplified analog audio signal. Thus, it is necessary to properly adjust the amplification ratio of the amplifier 320 depending on the magnitude of the input analog audio signal.

Figure 12:
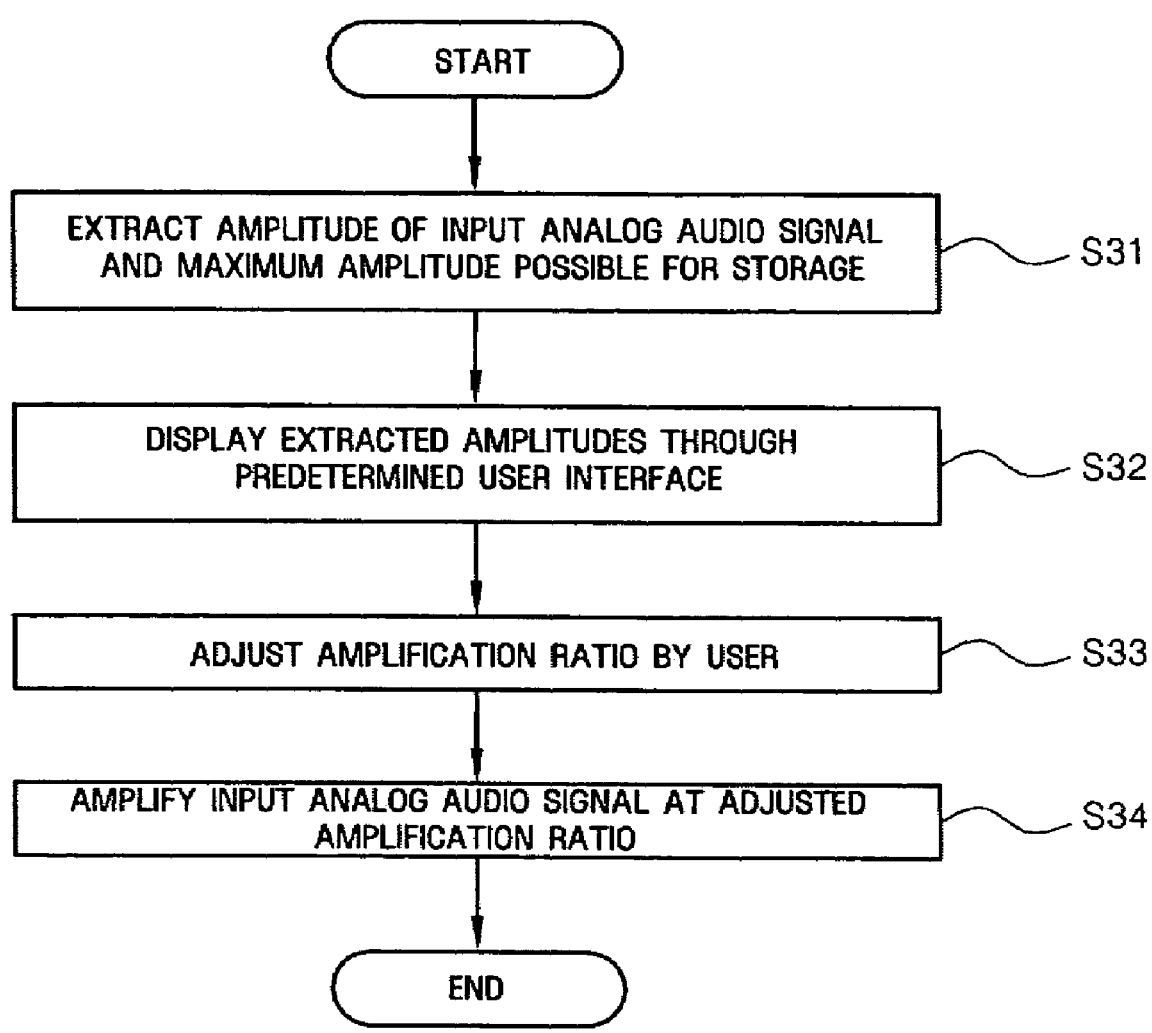
FIG. 12 is a flowchart illustrating a method for adjusting the amplification ratio of an amplifier according to a first embodiment of the present invention.

A method for adjusting the amplification ratio of the input analog audio signal according to a first embodiment of the present invention will now be described with reference to FIG. 12. In step S31, amplitude of an analog audio signal that was previously fed through the input 310 for a predetermined period of time and maximum possible amplitude of digital data that can be stored in the storage unit 350 are extracted. The magnitude of the input analog audio signal may be sensed by a sensor separately installed in the input 310 or by the digital signal processor 340 using amplitudes of previously input digital audio signals as shown in the assembly of FIG. 5 and the assembly of FIG. 6.

In step S32, the amplitude of digital audio signal previously input for a predetermined period of time and the maximum possible amplitude that can be stored in the storage unit 350 are displayed on the display 360 through a predetermined user interface. The amplitude of the digital audio signal and the maximum possible amplitude can be separately displayed or represented by a ratio of the maximum possible amplitude to the amplitude of the digital audio signal or a gain that can be maximally amplified.

In step S33, the key manipulator 370 of FIGS. 5 and 6 allows the user to adjust the gain of the amplifier 320 through the user interface displayed through the display 360. Information on maximum, minimum, average amplitudes at a specified time can be considered when performing these statistical calculations.

In step 34, the amplifier 320 amplifies the input analog audio signal at a gain adjusted by the user. Instead of manually adjusting the gain by the user, the gain can be adjusted automatically using the magnitude of the input analog audio signal and the maximum possible amplitude possible that can be stored in the storage unit 350.

Figure 13:
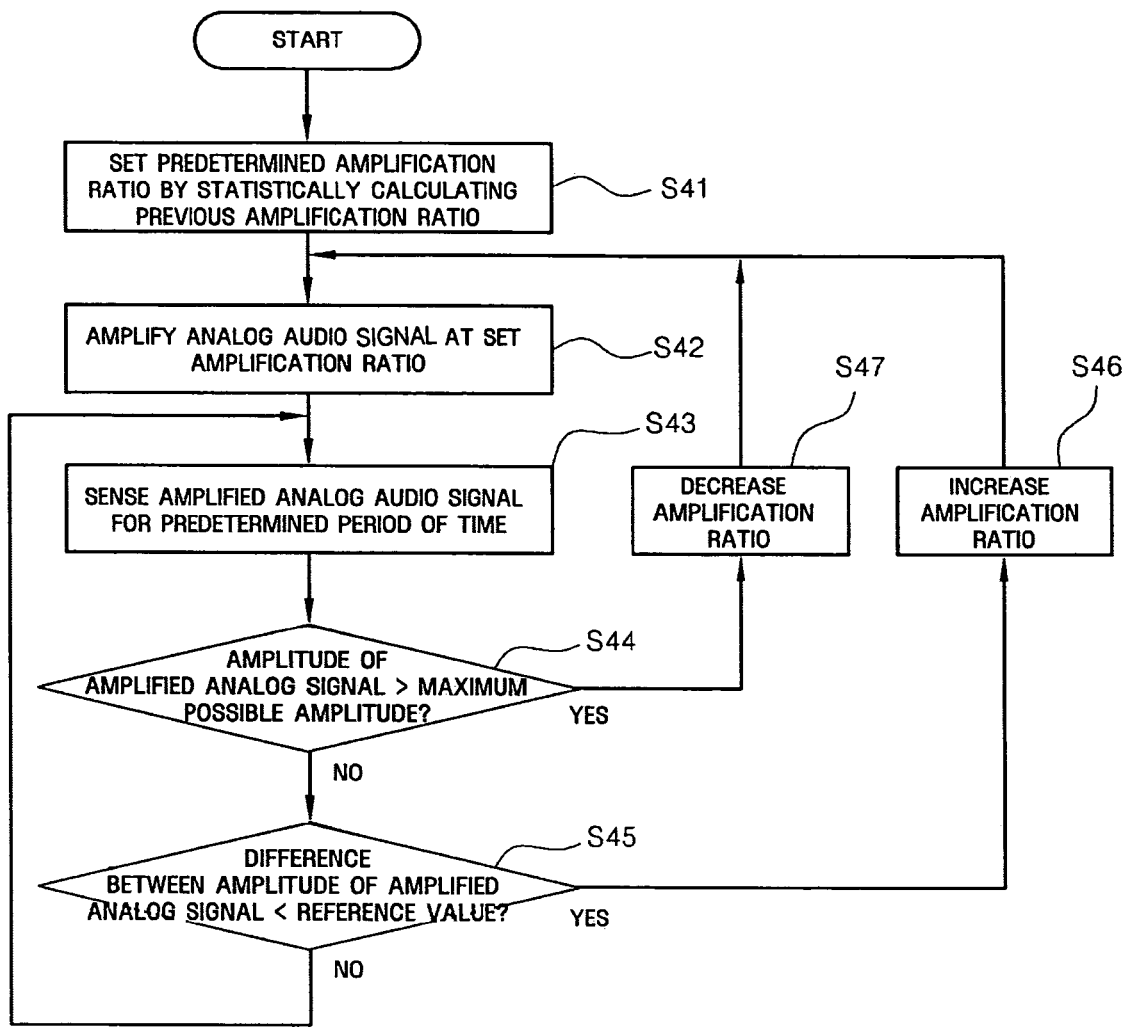
FIG. 13 is a flowchart illustrating a method for adjusting the amplification ratio of an amplifier according to a second embodiment of the present invention.

A method for automatically adjusting the gain of the amplifier 320 will now be described in detail with reference to FIG. 13. In step S41, a statistical calculation is performed for a predetermined gain by statistically calculating a gain previously used by the amplifier 320.

In step S42, when an analog audio signal having a predetermined amplitude is fed through the input 310, the amplifier 320 having the set gain amplifies the input analog audio signal.

In step S43, the amplitude of the amplified analog audio signal is sensed during a predetermined period of time.

In step S44, the result is analyzed to determine whether the magnitude of the amplified analog audio signal exceeds the maximum possible amplitude that can be stored in the storage unit 350. This can be determined by the occurrence of an overflow when converting an analog audio signal into a digital signal.

In step S45, when the magnitude of the amplified analog audio signal does not exceed the maximum possible amplitude, the difference between the two values is calculated to determine whether the difference is greater than a reference value. When the difference is greater than the reference value, the initial gain of the amplifier 320 is increased in step S46 to improve sound quality. Conversely, when the magnitude of the amplified analog audio signal exceeds the maximum possible amplitude, the amplification ratio is decreased in step 47.

When the difference between the maximum possible amplitude and the amplitude of the amplified analog audio signal is less than or equal to the reference value, the process returns to the steps S43, S44, and S45 for comparison between the amplified analog audio signal and the maximum possible amplitude.

In another embodiment, while an input analog audio signal is being amplified by the amplifier 320 having an amplification ratio adjusted by the user, the amplification ratio of the amplifier 320 can also be adjusted automatically to prevent signal distortion when there is a sharp change in an input analog audio signal upon comparison between the amplified analog audio signal and the maximum possible amplitude.

According to the present invention, a signal with small magnitude more closely approximates the original signal by varying an amplification ratio depending on the magnitude of the input analog audio signal. This enables amplifying the input analog audio signal to a maximum possible amplitude corresponding to the number of bits that can be stored when converting the analog audio signal into digital data. The present invention also allows the amplitude of an amplified analog audio signal to be reconstructed if necessary, thereby providing better sound quality with the same level of sound.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for converting an analog audio signal into digital data, comprising:
   an amplifier for amplifying an input analog audio signal to an adjustable maximum possible amplitude that can be stored as digital data;
   a converter for converting the amplified analog audio signal into digital data;
   a storage unit for storing the digital data, the maximum possible amplitude corresponding to the number of bits used to store digital data in said storage unit;
   a processing unit for setting an amplification ratio of the input analog audio signal using a predetermined statistical value; and
   a sensor for sensing an amplitude of the amplified analog audio signal using said set amplification ratio,
   wherein the processing unit adjusts said amplification ratio of the input analog audio signal according to the result of sensing by said sensor.

2. The apparatus of claim 1, wherein the sensor is one of the processing unit and a sensor installed in an input unit that provides the input analog audio signal to the amplifier.

3. The apparatus of claim 1, further comprising a reconstructor for restoring the volume of the digital data created by the converter.

4. The apparatus of claim 3, wherein the reconstructor increases a number of sampling levels when the converter has a resolution that is less than the number of bits of digital data that can be stored, wherein quantiziation error is reduced.

5. A method for converting an analog audio signal into digital data, the method comprising:
   amplifying an input analog audio signal to a maximum amplitude that can be stored as digital data;
   converting the amplified analog audio signal into digital data and reducing an amplitude of the digital data to an amplitude of the input analog audio signal using a resolution that is less than the number of bits used to store digital data;
   storing the created digital data;
   setting an amplification ratio of the input analog audio signal using a predetermined statistical value;
   sensing an amplitude of the amplified analog audio signal using said set amplification ratio; and
   adjusting said amplification ratio of the input analog audio signal according to the result of said sensing step.

6. The method of claim 5, wherein the step of sensing of the amplitude of the amplified analog audio signal comprises:
   determining whether an amplitude of the analog audio signal amplified at said set amplification ratio exceeds a maximum possible amplitude; and
   comparing a difference between both amplitudes with a predetermined reference value when an amplitude of the amplified analog audio signal does not exceed the maximum possible amplitude.

7. The method of claim 5, further comprising displaying a ratio of an amplitude of the input analog audio signal to the maximum possible amplitude that can be stored.

8. The method of claim 5, further comprising increasing an amplitude of the input analog audio signal to the maximum level possible without distortion.

9. The method of claim 5, further comprising adjusting the amplification ratio depending on the magnitude of the input analog audio signal.

10. The method of claim 5, wherein the amplifying is in accordance with an amplifier gain, the method further comprising adjusting the gain manually.

11. The method of claim 5, wherein the amplifying is in accordance with an amplifier gain, the method further comprising adjusting the gain automatically.

12. A method for converting an analog audio signal into digital data, the method comprising:
   amplifying an input analog audio signal to a maximum amplitude that can be stored as digital data;
   converting the amplified analog audio signal into digital data;
   storing the created digital data;
   setting an amplification ratio of the input analog audio signal using a predetermined statistical value;
   sensing the amplitude of the amplified analog audio signal using the set amplification ratio; and
   adjusting the amplification ratio of the input analog audio signal according to the result of said sensing.

13. The method of claim 12, wherein said step of sensing of the amplitude of the amplified analog audio signal comprises:
   determining whether an amplitude of the analog audio signal amplified at the set amplification ratio exceeds a maximum possible amplitude; and
   comparing a difference between both amplitudes with a predetermined reference value when the amplitude of the amplified analog audio signal does not exceed the maximum possible amplitude.

14. The method of claim 12, further comprising displaying a ratio of an amplitude of the input analog audio signal to the maximum possible amplitude that can be stored.

15. The method of claim 12, further comprising increasing an amplitude of the input analog audio signal to the maximum level possible without distortion.

16. The method of claim 12, further comprising adjusting the amplification ratio depending on the magnitude of the input analog audio signal.

17. The method of claim 12, wherein the amplifying is in accordance with an amplifier gain, the method further comprising adjusting the gain manually.

18. The method of claim 12, wherein the amplifying is in accordance with an amplifier gain, the method further comprising adjusting the gain automatically.

* * * * *